United States Patent
Makanvand

[19]

[11] Patent Number: 6,018,280

[45] Date of Patent: Jan. 25, 2000

[54] BROAD-BAND HIGH-POWER RF COMBINER

[75] Inventor: Shawn Makanvand, Anaheim Hills, Calif.

[73] Assignee: American Microwave Technology Inc., Anaheim, Calif.

[21] Appl. No.: 09/133,624

[22] Filed: Aug. 13, 1998

[51] Int. Cl.$^7$ ........................................ H03H 7/48

[52] U.S. Cl. ............................. 333/137; 333/100

[58] Field of Search ..................... 333/119, 131, 333/25, 100

[56] References Cited

U.S. PATENT DOCUMENTS

| | | | |
|---|---|---|---|
| 5,097,234 | 3/1992 | Andresen | 333/131 X |
| 5,220,297 | 6/1993 | Crowhurst | 333/131 X |
| 5,424,695 | 6/1995 | Konishi | 333/131 |

OTHER PUBLICATIONS

Sooho, *Theory and Application of Ferrites*, Prentice–Hall, N.J., pp. 142, 143 Relied on TK7870S55, 1960.

Schlicke, *Essentials of Dielectromagnetic Engineering*, John Wiley & Sons, New York, pp. 60, 61, 68 Relied on TK7835S28, 1961.

*Primary Examiner*—Paul Gensler
*Attorney, Agent, or Firm*—Anthony J. Casella; Gerald E. Hespos

[57] ABSTRACT

An RF combiner, of the Wilkinson type, capable of very wide band and high power continuous wave (CW) energy transmission, e.g., of a 5 way design, consisting of 5 input connected transformers coupled to two output providing transformers, with 5 balancing resistors respectively connected between the input terminals to the input connected transformers. The transformers are provided with ferrite cores in the form of one block for the input transformers and one block for the output transformers and the broader frequency band is obtained by properly selecting the ferrite material of the blocks making up the transformer cores, preferably with a permeability of 1600 that will provide a 2–150 MHz frequency range.

8 Claims, 6 Drawing Sheets

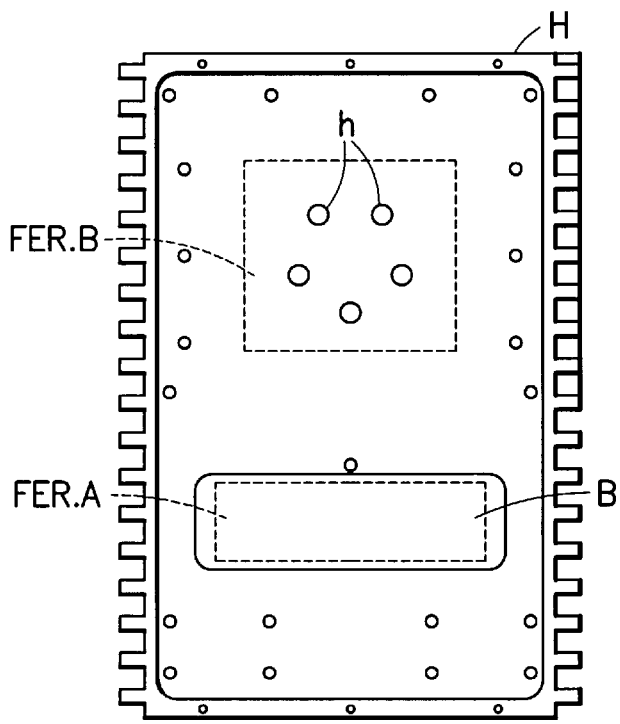
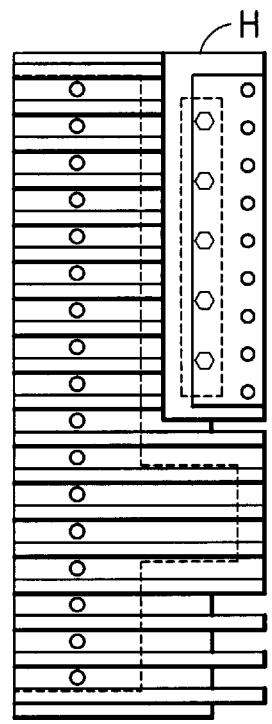
FIG.2a
FIG.2b
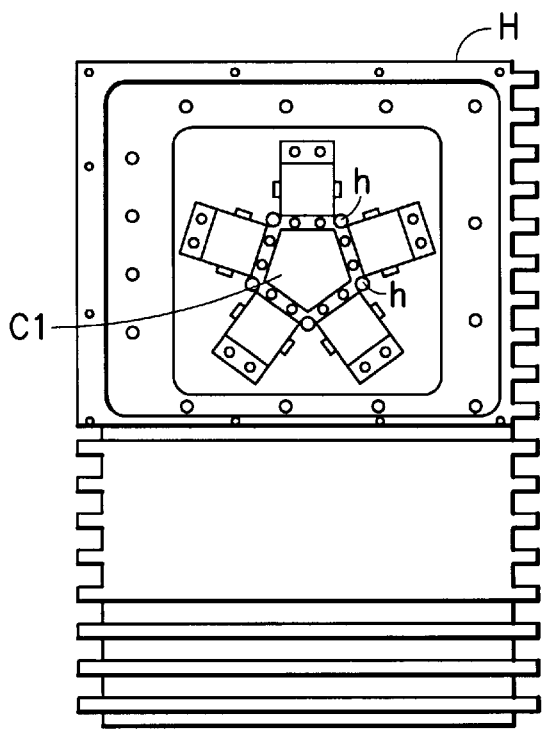
FIG.2c

BROAD-BAND HIGH-POWER RF COMBINER

BACKGROUND OF THE INVENTION

1. Field of the Invention

The present invention relates to microwave combiners and more particularly to a continuous wave (CW) radio frequency (RF) combiner of the Wilkinson type that combines a number of inputs, e.g., 5 way, and is capable of very wide band and high power transmission.

2. Description of the Prior Art

Combiners are known in the microwave transmission art for combining a number of RF inputs into a single output in a transmission system. It is common in such systems to use combiners of the Wilkinson type, such as shown in FIG. 1, constituting output transformers, T1–T2, providing an output on terminal, J6, and a plurality of input transformers, e.g., five, T3–T7, receiving respective inputs on terminals J1–J5. The transformers are magnetically coupled through ferrite cores, FER1–FER7, and the transmissions are over coax cable transmission lines CC. A balancing resistor (R1–R4) is connected across each set of the input terminals, J1–J5, with a single resistor R5 connected across the extreme terminals J1 and J5. The value of the resistors is typically determined using the empirically evaluated characteristic impedance of the coax cables. The number of input transformers shown in FIG. 1 is five so that the combiner depicted is a 5 way combiner, but this type of combiner also may have other numbers of inputs applied thereto, particularly continuous wave (CW) inputs.

In such combiners, the operating frequency range and power is limited by the ferrite loaded input with an extended frequency range being dependent upon the selection of the proper ferrite material as well as the parasitic inductance and capacitance of the other components. The power level is a function of the resistor layout and the sizes of the ferrite and coax cables.

It is therefore a problem in the art to achieve an extended frequency range in CW Wilkinson type combiners with higher power operation.

It is accordingly an object of the present invention to provide an improved RF combiner with an extended frequency range and higher power operation.

It is another object of the invention to provide a CW Wilkinson type combiner capable of operating with a very broad band of frequencies and a high power level having large balancing resistors.

It is a further object of the invention to provide an improved CW RF combiner with an extended frequency range of 2 to 150 MHz and higher power operation at a minimum 4 KW power level.

It is also an object of the invention to provide an improved CW RF combiner with an extended frequency range and higher power operation and of an odd number of inputs to be combined.

SUMMARY OF THE INVENTION

The present invention involves a microwave combiner capable of very wide band and high power continuous wave energy transmission. In the preferred embodiment the combiner of the invention is in the form of an improved at least 4 KW, continuous wave (CW), 2–150 MHz, 5 way RF combiner of the Wilkinson type. As seen in FIG. 1, Wilkinson type combiners consist of a plurality of input connected transformers, T3–T7, coupled to output providing transformers, T1–T2. The transformers are constructed with ferrite cores, FER1–FER7, formed of two ferrite blocks FER-A and FER-B, one for the input and one for the output transformers, and the broader frequency band is obtained by properly selecting the ferrite material of the blocks making up the transformer cores. It has been found that in the 5 way combiner of FIG. 1, a ferrite material with a permeability of 1600, such as that commercially obtainable from Ceramic Magnetics, of Fairfield, N.J., identified as 5005 ferrite material, will provide a frequency range of at least 2–150 MHz.

Balancing resistors, R1–R4, are respectively connected between the input terminals, J1–J5, to the input connected transformers, T3–T7, and a fifth resistor, R5, is connected between the extreme terminals, J1 and J5. For higher power operation, of the order of at least 4 KW, the size of the balancing resistors is selected to produce the needed power dissipation. All of the transmission lines are 50Ω coaxes and the balancing resistors preferably have a value of 110Ω. The value of the balancing resistors is determined using the relationship:

$$R_{BAL} = R_{TERM} \times (n)^{1/2},$$

where $R_{TERM}$ is the characteristic impedance of the system, and n is the number of ways the combining is taking place. As the transmission lines are coax cables, the characteristic impedance of which has been determined empirically to be 50Ω, in a 5 way combiner, the balancing resistor values are:

$$R_{BAL} = 50\Omega \times (5)^{1/2} = 111.8\Omega.$$

Thus, rounding off the computed value, a resistor value of 110Ω has been found to be appropriate for the 5 way combiner.

The layout of the transformer and resistor components of the combiner dictates the shape and size of the ferrite blocks. For example, the 5 way combiner may be arranged with the balancing resistors R1–R5 in a pentagon or "star" configuration disposed in one cavity of a housing having a dual cavity construction with one cavity on each side of a main heat sink portion of the housing. The ferrite blocks are contained in the cavity opposite that of the resistors and the components in the cavities are connected, through holes in the blocks, by coax cables which pass through the main heat sink. The 110Ω balancing resistors R1–R5 being physically larger, their internal capacitance (i.e., lead to flange capacitance) is larger, which can cause severe roll off in the frequency response. This capacitance may be minimized by mounting the flanges of the resistors to a separate heat sink arrangement, which is electrically de-coupled from the main heat sink of the combiner. Also, to prevent the de-coupled assembly from acting as an antenna and radiating energy, the energy radiation may be minimized by housing the entire assembly in a large shielding device.

BRIEF DESCRIPTION OF THE DRAWING

The present invention will be described in more detail below with reference to the accompanying drawings in which:

FIGS. 2a–2c are top, side, and bottom views of a housing for the combiner of FIG. 1 and showing in FIG. 2a horizontally mounted and vertically mounted ferrite blocks for the input and output transformers disposed in one cavity on the upper portion of the combiner housing and in FIG. 2c a cover for the 5 balancing resistors in another cavity on the bottom portion of the combiner housing.

DETAILED DESCRIPTION OF THE PREFERRED EMBODIMENT

Figure 1:
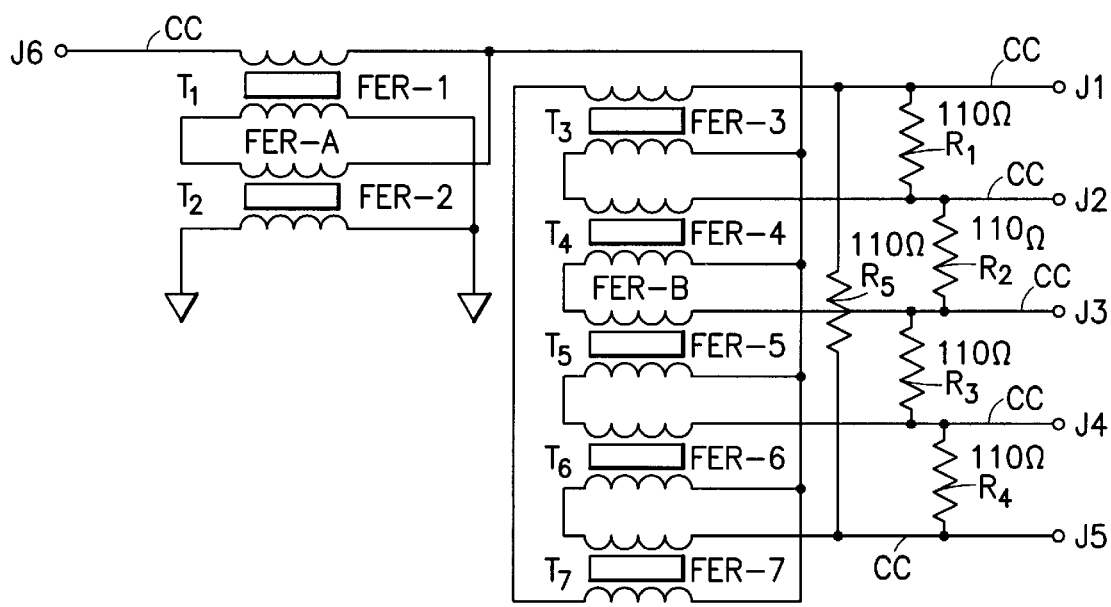
FIG. 1 is a schematic diagram of a prior art Wilkinson type combiner in which the present invention may be incorporated.

The present invention is directed to providing a microwave combiner capable of very wide band and high power continuous wave energy transmission. As seen in FIG. 1, a combiner in accordance with the invention, a 5 way combiner in this preferred embodiment, is of the Wilkinson type with two output transformers T1 and T2 magnetically coupled through one ferrite block (FER-A in FIG. 3), and five input transformers T3–T7 magnetically coupled through another ferrite block (FER-B in FIG. 3). An extremely broad band performance is achieved by using ferrite material having a permeability of 1600 for the blocks. An example, of a suitable material for this purpose is obtainable from Ceramic Magnetics, of Fairfield, N.J., as 5005 ferrite material. The use of this material will provide a frequency range of 2–150 MHz. Each of the input transformers T3–T7 has a winding connected to a respective input terminal J1–J5 and the terminals are successively connected to each other by four balancing resistors R1–R4 with a single resistor R5 connected across the extreme terminals J1 and J5. The other windings of input transformers T3–T7 are commonly connected to the output terminal J6 of one winding of output transformer T1, the other winding of which is commonly connected with a winding of transformer T2 to the other windings of T3–T7. The other winding of T1 is also connected in common with the other winding of T2 to a reference source (ground) Terminal J6 is preferably a ⅞" connector and terminals J1–J5 are n-types.

As the power requirements are increased, bigger balancing resistors R1–R5 are required to absorb the mismatch power in the event one or more of the inputs do not have equal amplitude or phase relative to the other inputs. For higher power operation, of the order of a minimum of 4 KW, the balancing resistor size is selected to produce the needed power dissipation. The value of the balancing resistors is determined using the relationship:

$$R_{BAL} = R_{TERM} \times (n)^{1/2},$$

where $R_{TERM}$ is the characteristic impedance of the system, and n is the number of ways the combining is taking place. In the present embodiment, the transmission lines are coax cables the characteristic impedance of which has been determined empirically to be 50Ω. Accordingly, in a 5 way combiner, the balancing resistor values are:

$$R_{BAL} = 50\Omega \times (5)^{1/2} = 111.8\Omega.$$

Rounding off the computed value, a resistor value of 110Ω has been found to be appropriate for the 5 way combiner of the present embodiment.

Figure 3:
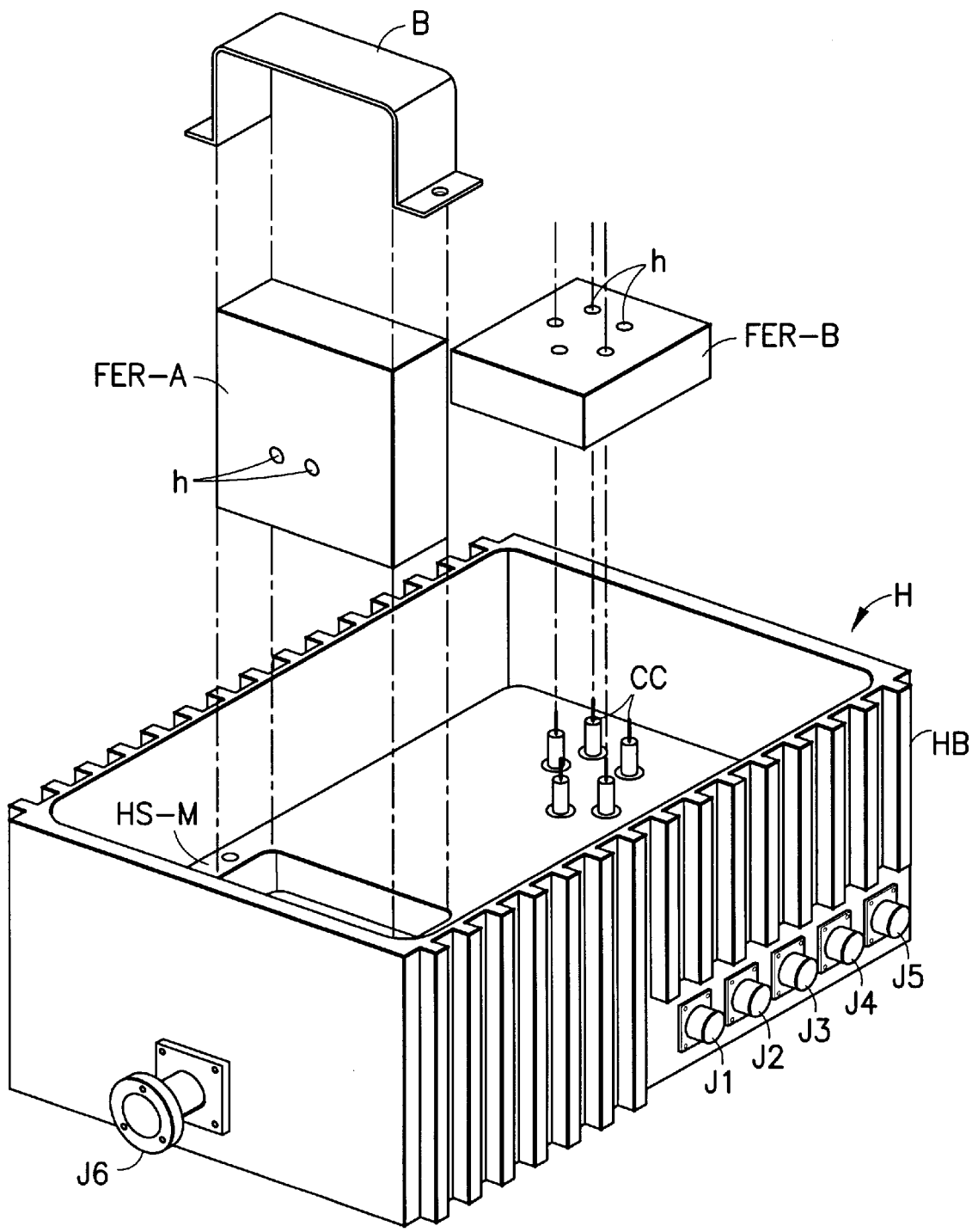
FIG. 3 is an exploded view illustrating in greater detail the relationship of the horizontally mounted and vertically mounted ferrite blocks with respect to the main heat sink in the combiner housing and showing the holes in the blocks for passing coax cables as well as the coax cables of the input terminals.
Figure 4:
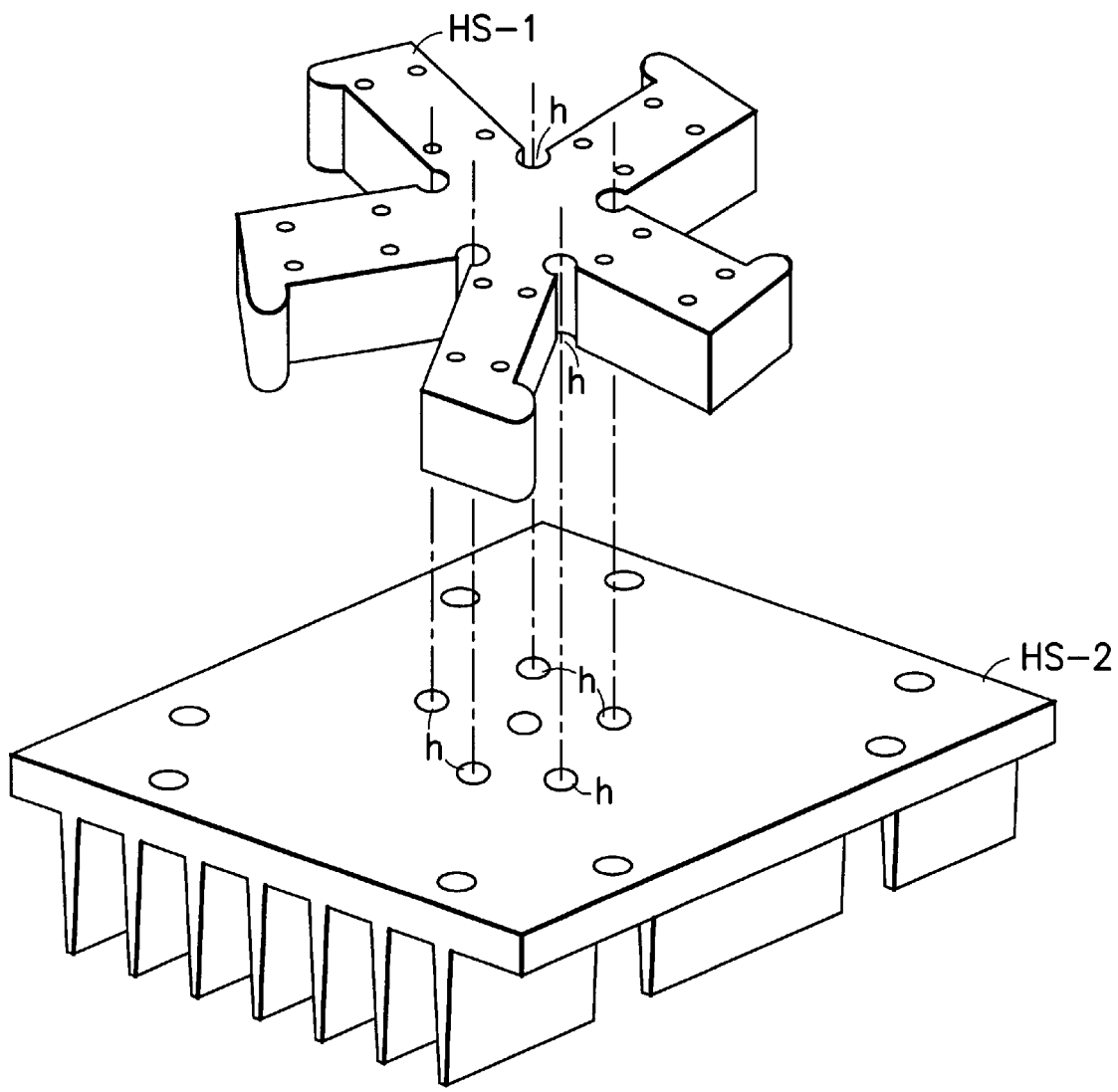
FIG. 4 is an exploded view showing in greater detail a "star" shaped heatsink for holding the 5 balancing resistors beneath the resistor cover in the bottom cavity of the combiner housing shown in FIG. 2c along with a finned decoupling heatsink disposed behind the star shaped heatsink and attached directly thereto, but electrically decoupled from the main heatsink by non-conductive material disposed between them.

However, these 110Ω balancing resistors being physically larger, their internal capacitance (i.e., lead to flange capacitance) is larger causing severe roll off in the frequency response. A preferred way to minimize this capacitance is by mounting the flanges of the resistors to a heat sink, that is disposed in a combiner housing and electrically de-coupled from the main heat sink of the combiner. In this regard, FIGS. 2a–2c show top, side, and bottom views of a housing arrangement for the combiner. In a preferred embodiment, the housing H is of a dual cavity construction, one cavity on each side of an intermediately disposed main heat sink. Other portions and the entire housing body may also contribute to the functioning of the main heat sink. The cavity on one side, the top as seen in FIG. 2a, contains the two ferrite blocks, one, FER-B for the input transformers T3–T7, horizontally mounted, and the other, FER-A for the output transformers T1 and T2, vertically mounted and secured with a bracket B (FIG. 3). The cavity on the other side, the bottom as shown in FIG. 2c, contains the 5 balancing resistors mounted in a pentagon configuration under a "star" shaped cover C1 in a cavity on the bottom of the combiner housing. A "star" shaped heatsink HS-1, shown in FIG. 4, holds the 5 balancing resistors beneath the resistor cover C1 in the bottom cavity and has a decoupling finned heat sink, HS-2, attached directly to it, which latter heat sink is electrically decoupled from the main heat sink HS-M by the use of non-conductive material at their mechanical contact surfaces.

Input coax cables CC are connected (FIG. 3) to input terminals J1–J5 in the side of the housing body HB and are coupled to the balancing resistors R1–R5 through 5 holes h at the roots of the "star" arms of the cover C1 (FIG. 2c). They then pass through similar holes h in the roots in the heat sink HS-1 and in the body of heat sink HS-2 (FIG. 4) from the cavity on one side to the cavity on the other side of the housing H through the main heat sink HS-M (FIG. 3) to the input transformers T3–T7 windings. Cables are passed through 5 holes in the ferrite block FER-B and two holes in the ferrite block FER-A, as seen in FIG. 3, in connecting the input transformers T3–T5 and output transformers T1, T2 and in coupling the latter to the output terminal J6.

A further problem posed by this housing and heat sink arrangement is that the de-coupled heat sink assembly, HS-1 and HS-2, can act as an antenna and radiate some energy. To minimize this radiation, the entire assembly can be housed in a large shielding device. In turn, the layout of the combiner transformers and resistors, such as the pentagon arrangement shown in FIG. 2c, dictates the shape and size of the ferrite blocks, FER-A and FER-B, of the transformers' cores. The shape of the blocks and their layout are then based on the resistor size needed for the power dissipation desired.

Figure 5A:
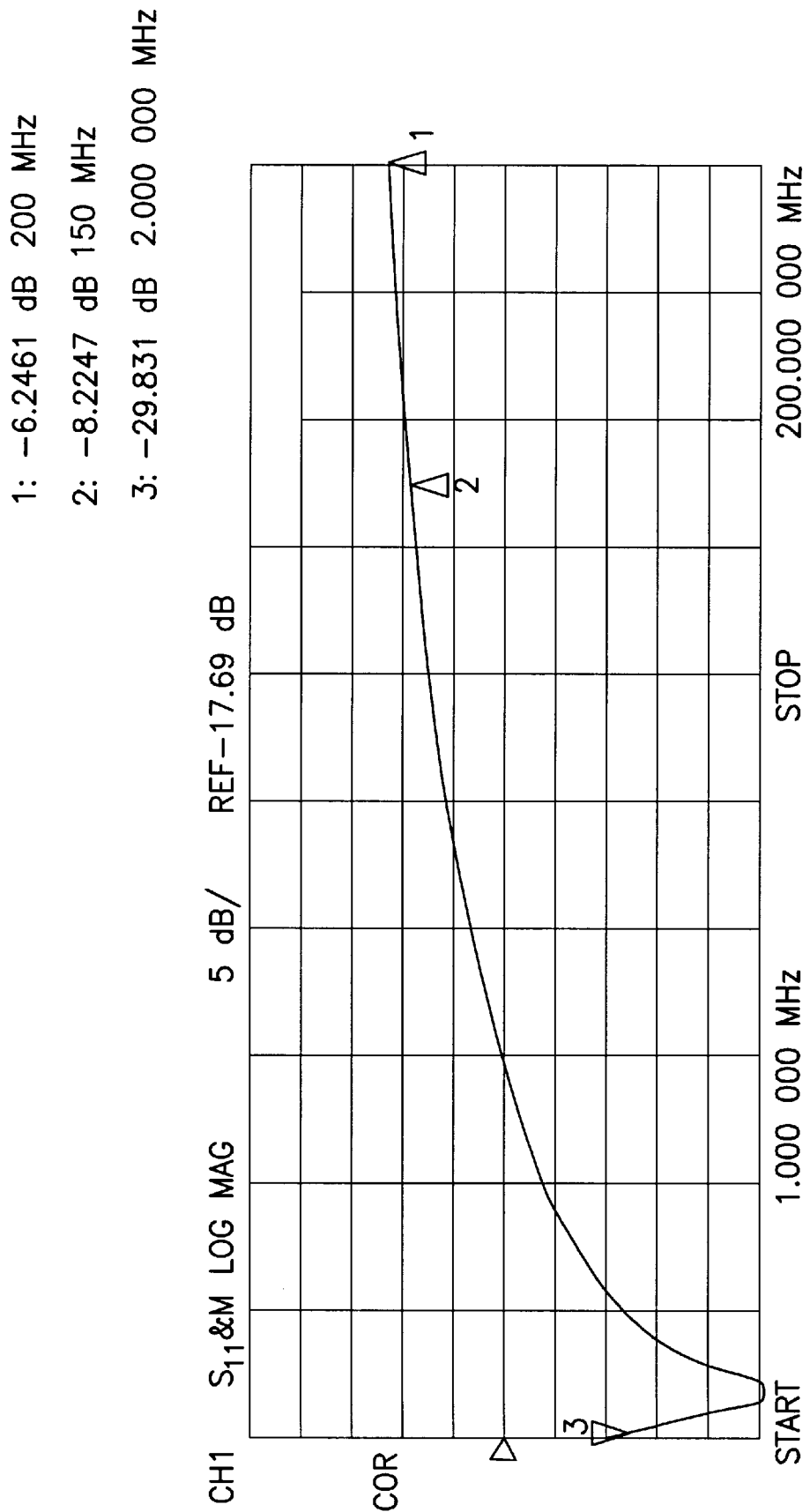
FIGS. 5A and 5B are plots respectively illustrating the typical insertion loss and return loss of the 5 way combiner of the invention.
Figure 5B:
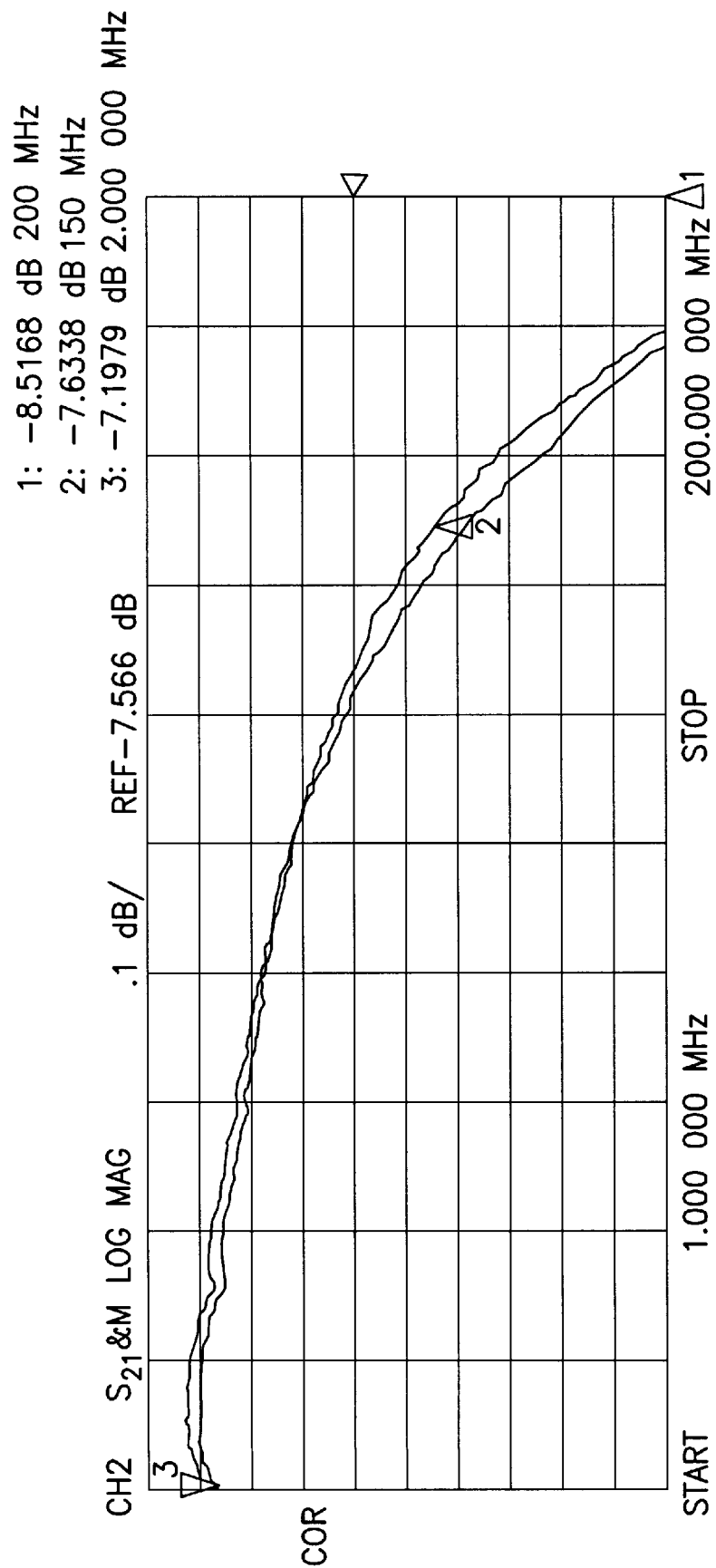

The heat generated inside the ferrite blocks FER-A and FER-B is dissipated by conduction to the main heat sink portion HS-M of the housing body HB shown in FIG. 3. Even though some roll off is inevitable, nevertheless, as noted above, with the resistors' flanges electrically de-coupled from the main heat sink the roll off is substantially less than when the resistors are coupled to the main heat sink. The insertion loss although adequate for the application intended, may be still too high for other applications. In such situations, engineering judgements have to be made on a case by case basis using the operating and structural principles of the present invention. FIGS. 5A and 5B show respectively plots of the typical insertion loss and return loss of a 5 way combiner in accordance with the invention.

It will therefore be seen that an improved CW RF combiner with an extended frequency range and higher power operation has been disclosed of the Wilkinson type that is capable of operating with a very broad band of frequencies, such as a range of 2 to 150 MHz, and a high power level, at a minimum of 4 KW, using an odd number of large balancing resistors.

It should be noted that the preferred embodiment has been described in terms of a 5 way combiner, but those of skill will understand that combiners from 2 way to 6 way are contemplated as possible implementations of the invention. Accordingly, while the present invention has been described in terms of specific embodiments and combinations, it will be appreciated that the invention is not limited to the particular examples presented herein, and that the scope of the protection is defined in the attached claims.

What is claimed is:

1. An RF combiner capable of very wide band and high power continuous wave energy transmission comprising:

a plurality of input transformers, disposed in a Wilkinson type arrangement, having ferrite cores formed of a first block of ferrite material, wherein the ferrite material of said first block has a permeability of 1600;

a plurality of input terminals respectively connected to said input transformers;

a plurality of balancing resistors respectively connected between said input terminals of said input transformers;

a plurality of output transformers coupled to said input transformers;

a housing having dual cavities, one cavity on each side of a heat sink portion; and wherein said input transformers comprise said first ferrite block and said output transformers comprise a second ferrite block and wherein the cavity on one side of said heat sink portion contains the two ferrite blocks, and the cavity on the other side contains the balancing resistors.

2. An RF combiner as in claim 1, wherein the ferrite material of said second block has a permeability of 1600.

3. An RF combiner as in claim 2, wherein said combiner comprises a Wilkinson type 5 way combiner with two output transformers coupled to 5 input transformers, with each input transformer having an input terminal and 5 balancing resistors respectively connected between their input terminals.

4. An RF combiner as in claim 3, wherein said input terminals are coupled to 50Ω coax cables and said 5 balancing resistors have values of 110Ω.

5. An RF combiner as in claim 4, wherein said high power continuous wave energy transmission is a minimum of 4 KW.

6. An RF combiner as in claim 4, wherein said very wide band frequency is in the range of at least 2–150 MHZ.

7. An RF combiner as in claim 1, further comprising coax cables respectively connected to said input terminals and wherein said coax cables make connections from one side of said housing to the other through said heat sink portion.

8. An RF combiner as in claim 1, further comprising a second heat sink electrically de-coupled from said heat sink portion and wherein the lead to flange internal capacitance of said balancing resistors is minimized by mounting the flanges of the resistors to said second heat sink.

* * * * *